United States Patent
Wallace

(10) Patent No.: US 8,754,492 B2
(45) Date of Patent: Jun. 17, 2014

(54) SENSOR INTEGRATED SLIT FOR A PUSHBROOM HYPERSPECTRAL SYSTEM

(75) Inventor: Thomas H Wallace, Arlington, VA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 288 days.

(21) Appl. No.: 13/356,687

(22) Filed: Jan. 24, 2012

(65) Prior Publication Data

US 2012/0292726 A1 Nov. 22, 2012

Related U.S. Application Data

(60) Provisional application No. 61/486,793, filed on May 17, 2011.

(51) Int. Cl.
*H01L 31/0232* (2014.01)

(52) U.S. Cl.
USPC .................................. 257/432; 257/E31.127

(58) Field of Classification Search
USPC .......................................... 257/432, E31.127
See application file for complete search history.

(56) References Cited

U.S. PATENT DOCUMENTS

2008/0116364 A1* 5/2008 Barron ........................ 250/252.1
2013/0193544 A1* 8/2013 Ozcan ........................... 257/432

* cited by examiner

*Primary Examiner* — Andy Huynh
(74) *Attorney, Agent, or Firm* — Maine Cernota & Rardin; Daniel J. Long

(57) ABSTRACT

An entry slit panel for a push-broom hyperspectral camera is formed at least partly from a silicon wafer on which at least one companion sensor is fabricated, whereby the companion sensor is co-planar with the slit and detects light imaged on the panel but not on the slit. In embodiments, the companion sensor is a panchromatic sensor or a sensor that detects light outside the wavelength range of the camera. At least a region of the wafer is back-thinned to a thickness appropriate for a diffraction slit. The slit can be etched or laser cut through the thinned region, or formed between the wafer and another wafer or a conventional blade. The wafer can be back-coated or metalized to ensure its opacity across the camera's wavelength range. The companion sensor can be located relative to the slit to detect scene features immediately before or after the hyperspectral camera.

13 Claims, 6 Drawing Sheets

SENSOR INTEGRATED SLIT FOR A PUSHBROOM HYPERSPECTRAL SYSTEM

RELATED APPLICATIONS

This application claims the benefit of U.S. Provisional Application No. 61/486,793, filed May 17, 2011, herein incorporated by reference in its entirety for all purposes.

FIELD OF THE INVENTION

The invention relates to camera systems, and more particularly, to pushbroom hyperspectral cameras.

BACKGROUND OF THE INVENTION

Hyperspectral imaging is essentially a three-dimensional imaging method, whereby the two spatial dimensions of an image are augmented by a third dimension in which the wavelength spectrum of each pixel is encoded. The result is a hyperspectral "data cube" of information, which can be highly useful in a wide range of application, including mining and geology (e.g. looking for ores and petroleum deposits), agriculture, and military surveillance.

A hyperspectral camera collects data as a set of images, where each image represents a wavelength range or band of the electromagnetic spectrum, where the detected wavelengths need not be limited to the visible spectrum. Depending on the wavelength range of each image, the method may be referred to as "ultraspectral" (for very fine spectral resolution), "hyperspectral" (for intermediate spectral resolution), or "multispectral" for fewer and/or broader spectral bands that span a wide range of wavelengths. All such related methods are referred to generically herein as "hyperspectral" unless otherwise required by the context.

Because each image produced by a hyperspectral camera includes only the light from a single wavelength band, in contrast with a "panchromatic" image that combines light over a wide range of wavelengths, a hyperspectral image will generally have a lower resolution than a panchromatic image obtained under similar conditions.

There are two basic types of camera for obtaining hyperspectral data. A "staring array" hyperspectral camera repeatedly images an entire scene through a tunable filter while advancing the wavelength of the filter so as to obtain the images for the different wavelength bands. One advantage of this approach is that the detected wavelength bands need not be contiguous, but can be selected according to the wavelength bands of interest for a particular application. Nevertheless, while staring array hyperspectral cameras are useful for some applications, the limited tuning rate of the optical filter can limit the data throughput.

The other basic type of hyperspectral camera is a "push-broom" hyperspectral camera. In contrast to a staring array camera, which images an entire scene at once and then steps or sweeps through a series of wavelength bands to obtain the data cube, a push-broom hyperspectral camera obtains only one line of an image at a time, but simultaneously obtains the full spectral information for each point on the line. The imaging line is then stepped or swept through the image to provide the complete data cube. Push-broom imaging is especially useful for monitoring industrial processes, where items are typically moving past the camera at a constant speed. Similarly, push-broom imaging is well suited to airborne applications, where the camera is steadily moved across a scene. In such applications, the push-broom approach of measuring the full wavelength information of a line at the same instant ensures that all the wavelength information is truly measured from the same portion of the scene, even though the scene is moving during the measurement.

Push-broom cameras obtain wavelength spectrum information by focusing an image of a scene onto a line-selecting slit, and then either reflecting the light that passes through the slit from a reflective grating, or by passing the light through a transmission grating or through a diffraction slit. The latter case is an especially simple and effective approach, because a single slit can serve as both the line-selecting slit and the diffraction slit.

The push-broom design avoids the delays associated with filter tuning in a staring array camera. However, a push-broom camera cannot select specific wavelength bands, but can only provide spectral information over a continuous range of wavelengths.

FIG. 1A is a perspective view illustrating the basic components of a single-slit push-broom hyperspectral camera of the prior art. A lens 100 focuses an image 102 onto image panel 104 that is penetrated by a thin and narrow diffraction slit 106. Typically, the diffraction slit 106 is wide enough to span most of the image 102. For example, typical dimensions might be a 25 mm diameter circular image 102 focused onto a 20 mm wide slit 106 that is 20 microns high.

Light 108 that passes through the slit 108 falls on a hyperspectral detector array 110 mounted on a detector panel 112. The data collected by the detector array 110 represents spatial information along one axis 114, and wavelength information along the other axis 116. Repetition of this measurement during movement 118 of the scene past the lens, or movement 118 of the camera past the scene, provides information in the other spatial dimension, and allows collection of the complete data cube.

FIG. 1B is a detailed front view of the image 102 focused on the slit 108 of FIG. 1A. Note that the height of the slit has been exaggerated to make it perceptible in the drawing. It is evident that most of the image 118 focused by the lens 100 does not pass through the slit 106 and is not used.

It is sometimes desirable to compensate for the shortcoming of a hyperspectral camera by simultaneously gathering data from the scene using other types of detectors as "companion" sensors. For example, the lower resolution of a hyperspectral camera can be compensated by simultaneously detecting light from the scene using one or more panchromatic sensors. Also, light can be detected from additional spectral bands of interest, for example light resulting from "Light Detecting and Ranging" (LIDAR), by using separate sensors that are either intrinsically sensitive to the wavelength bands of interest or include appropriate filters.

However, including companion sensors can require that the light from the lens pass through a splitter and be shared between the hyperspectral sensor and the companion sensors, thereby reducing the light available to the hyperspectral camera, and reducing the quality of the hyperspectral result. Another possibility is to provide light to the companion sensors using a separate optical system. However, this approach consumes significantly more space than the hyperspectral camera by itself. Also, it can be difficult to register the data from the companion sensors with the hyperspectral image, due to inevitable misalignments between the two optical systems.

What is needed, therefore, is an apparatus for detecting push-broom hyperspectral data cube images that includes companion sensors but does not reduce the amount of light reaching the hyperspectral sensor and does not require separate companion sensor optics.

SUMMARY OF THE INVENTION

An apparatus for detecting push-broom hyperspectral data cube images includes simultaneous detection of light from the scene using companion sensors without reducing the amount of light reaching the hyperspectral sensor and without requiring separate companion sensor optics. The apparatus takes advantage of the unused portions 118 of the scene image that are focused by the lens 100 onto the image panel 104 but do not pass through the diffraction slit 106. The fact that the additional data from the companion sensors is acquired through the same lens 100 and at nearly the same time and view angle as the hyperspectral data greatly simplifies the process of registering the companion sensor data with the hyperspectral image, since the optics are shared and hence inherently aligned.

Simply attaching companion sensors to the image panel 104 would be problematic, because the packaging of the companion sensors would consume space and separate the companion sensors from each other and from the diffraction slit 106. Also, the packaging of the companion sensors would tend to locate the companion sensors above the imaging plane of the lens 100.

The apparatus of the present invention overcomes these problems by using the silicon die or wafer on which the companion sensors are fabricated as an integral part of the diffraction slit assembly, either by fabricating the diffraction slit with one or both blades made of a companion sensor die, or by etching or laser cutting the diffraction slit directly into the silicon die.

At least a region of the silicon die is reduced in width to a thickness that is suitable for the diffraction slit by back-thinning it using any of the techniques that are routinely used to produce back-illuminated Charge Coupled Device (CCD) sensors. In embodiments, the back surface of the die is coated or aluminized to ensure that the thinned silicone is opaque over the full range of wavelengths to be detected by the hyperspectral sensor array.

In embodiments, companion sensors occupy locations where they will obtain data immediately after the hyperspatial sensor. In some of these embodiments, data obtained by the hyperspectral sensor is used to identify regions of interest in the scene, and to cue acquisition or special processing of data by the companion sensors. In other embodiments, companion sensors occupy locations where they will obtain data immediately before the hyperspatial sensor. In some of these embodiments, data obtained from a companion sensor is used to cue actions by the hyperspatial sensor. For example, data storage capacity can be conserved by using the companion sensors to cue the activation of the hyperspatial sensor, so that hyperspatial data is obtained only for scenes of interest.

One general aspect of the present invention is an image panel for use in a hyperspectral camera that is configured to scan a scene and obtain spectral image data over a defined range of wavelengths. The image panel includes a silicon die having a planar image surface, a rear surface, and a die thickness, a thinned region of the silicon die having a diffraction thickness that is equal to or less than the die thickness, a diffraction slit formed at least in part by the thinned region of the die, the diffraction slit having a width and a height, and at least one companion sensor fabricated in the silicon die and co-planar with the diffraction slit, the companion sensor being located such that an image of a scene focused onto the diffraction slit will also be focused onto the companion sensor.

In embodiments, the thinned region of the die extends to a side of the die, and the diffraction slit is bounded in part by a segment of the thinned region at the side of the die.

In some embodiments, the diffraction slit penetrates the thinned region of the die. In other embodiments the companion sensor is a panchromatic sensor.

In various embodiments the companion sensor is configured to detect light at a wavelength that is outside of the defined range of wavelengths. In certain embodiments a coating is applied to at least a portion of the rear surface, the coating rendering the portion of the rear surface substantially opaque to light over the defined range of wavelengths.

In some embodiments at least a portion of the rear surface is metalized, the metalized portion of the die being substantially opaque to light over the defined range of wavelengths. In other embodiments the companion sensor is located such that it will receive light from a portion of the scene immediately before light from the portion of the scene passes through the diffraction slit as the scene is scanned.

In certain embodiments the companion sensor is located such that it will receive light from a portion of the scene immediately after light from the portion of the scene passes through the diffraction slit as the scene is scanned.

In various embodiments the diffraction thickness is between 25 microns and 100 microns.

In some embodiments the at least one companion sensor is a 4096 pixel linear panchromatic sensor array. And in some of these embodiments the panchromatic sensor array has a five micron pixel pitch.

In other embodiments the height of the diffraction slit is 20 microns.

Another general aspect of the present invention is a method for fabricating an image panel for a hyperspectral camera that is configured to scan a scene and obtain spectral image data over a defined range of wavelengths. The method includes fabricating at least one companion sensor on a planar imaging surface of a silicon die, back-thinning at least a region of the silicon die to a diffraction thickness that is suitable for a diffraction slit, and forming a diffraction slit in the thinned region, the diffraction slit penetrating the silicon die in the thinned region, the diffraction slit being co-planar with the imaging surface of the silicon die.

In embodiments, the diffraction thickness is between 25 microns and 100 microns. In certain embodiments, n forming the diffraction slit includes at least one of etching and laser-cutting the silicon die in the back-thinned region.

Yet another general aspect of the present invention is a method for fabricating an image panel for a hyperspectral camera that is configured to scan a scene and obtain spectral image data over a defined range of wavelengths. The method includes fabricating at least one companion sensor on a planar imaging surface of a silicon die, back-thinning at least a region of the silicon die to a diffraction thickness that is suitable for a diffraction slit, the back-thinned region extending to an edge of the die, and forming a diffraction slit that is co-planar with the imaging surface by using the silicon die with the thinned region as a first blade and combining it with a second blade, so that the diffraction slit is formed between a segment of the thinned region at the edge of the silicon die and the second blade.

In embodiments, the second blade is a conventional diffraction slit blade. In certain embodiments the second blade is a second silicon die having a back-thinned region extending to an edge of the second silicon die. And in some of these embodiments at least one companion sensor is fabricated in the second silicon die.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention is an apparatus for detecting push-broom hyperspectral data cube images that includes simultaneous detection of light from the scene using companion sensors without reducing the amount of light reaching the hyperspectral sensor and without requiring separate companion sensor optics. The apparatus takes advantage of the unused portions 118 of the scene image that are focused by the lens 100 onto the image panel 104 but do not pass through the diffraction slit 106. The fact that the additional data from the companion sensors is acquired through the same lens 100 and at nearly the same time and view angle as the hyperspectral data greatly simplifies the process of registering the companion sensor data with the hyperspectral image, since the optics are shared and hence inherently aligned.

Simply attaching companion sensors to the image panel 104 would be problematic, because the packaging of the companion sensors would consume space and separate the companion sensors from each other and from the diffraction slit 106. Also, the packaging of the companion sensors would tend to locate the companion sensors above the imaging plane of the lens 100.

Figure 1A:
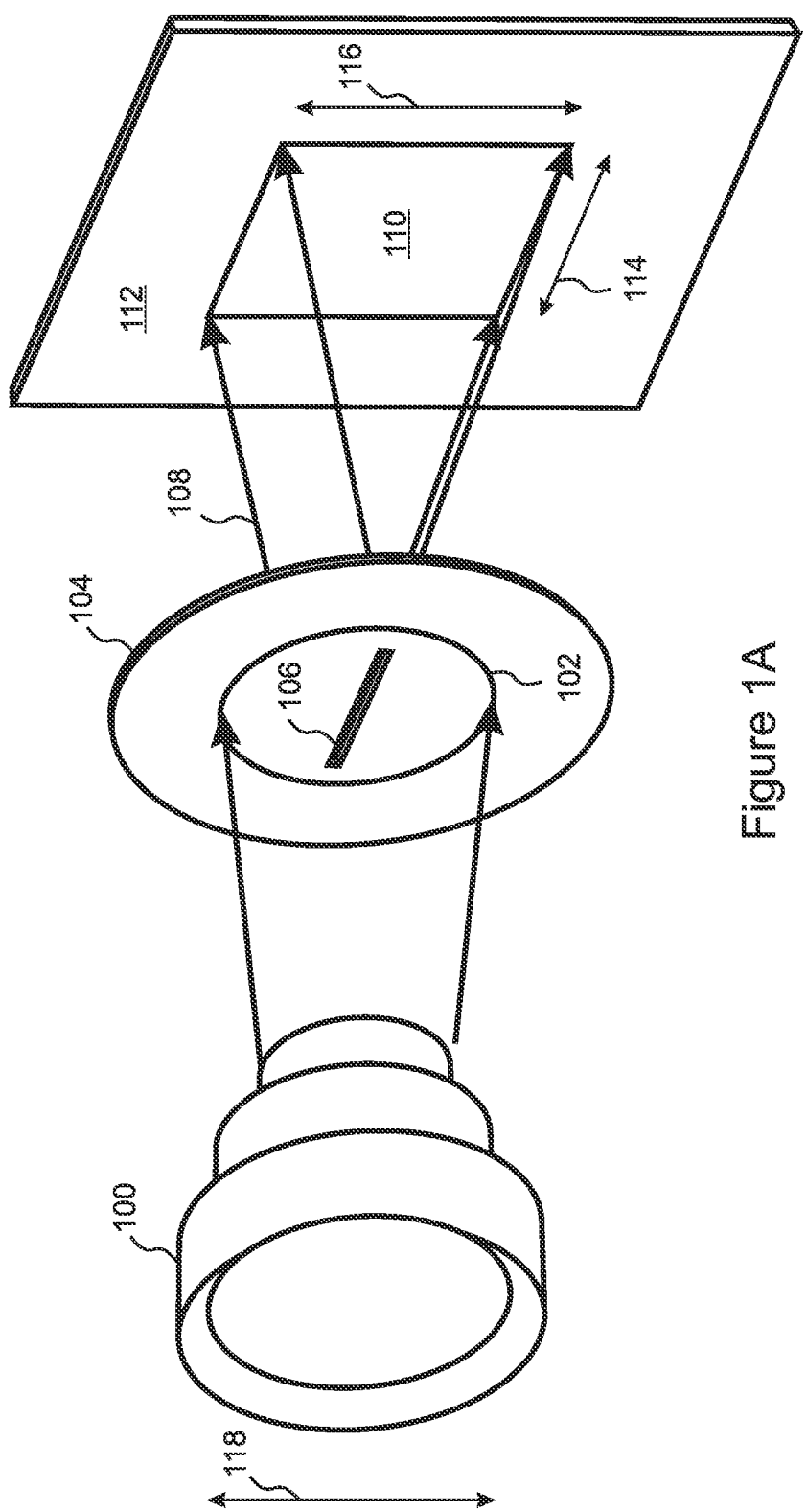
FIG. 1A is a perspective functional view of the basic elements of a hyperspectral camera of the prior art.
Figure 1B:
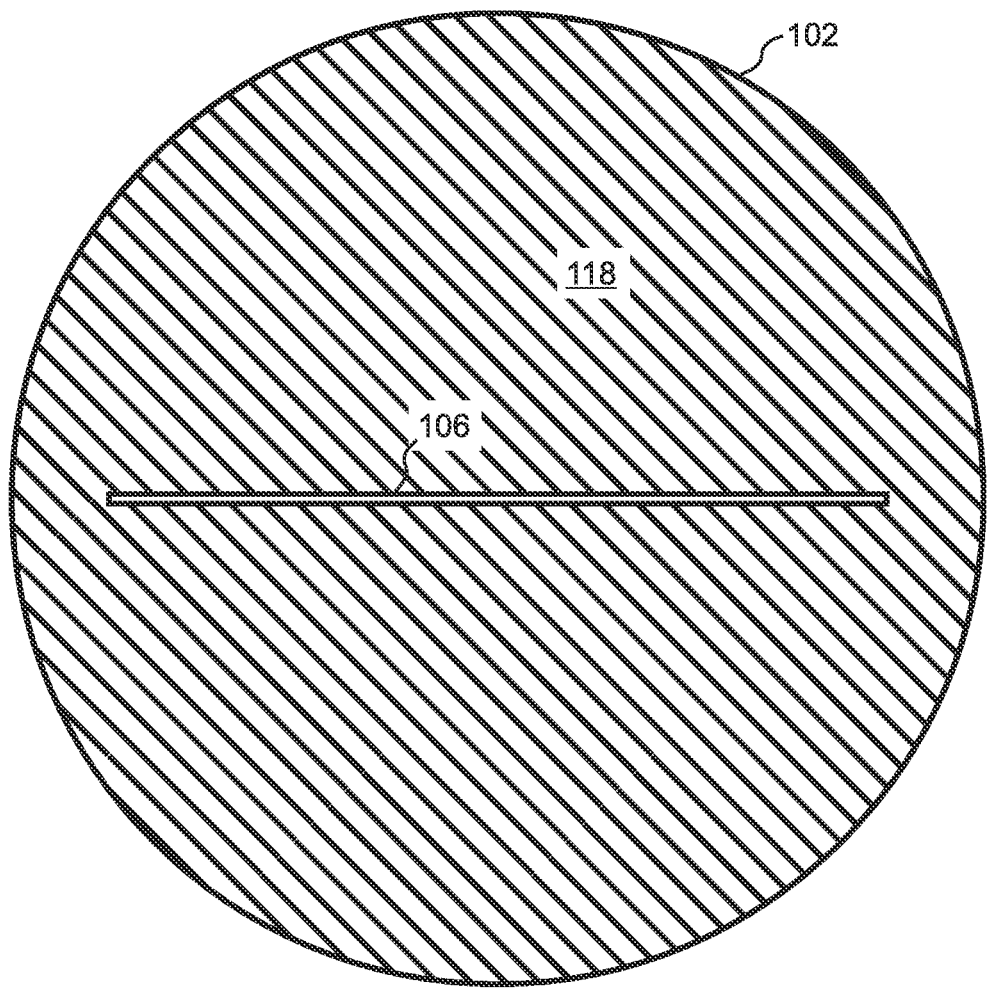
FIG. 1B is a close-up, front view of the focused image and diffraction slit of the camera of FIG. 1A.
Figure 2A:
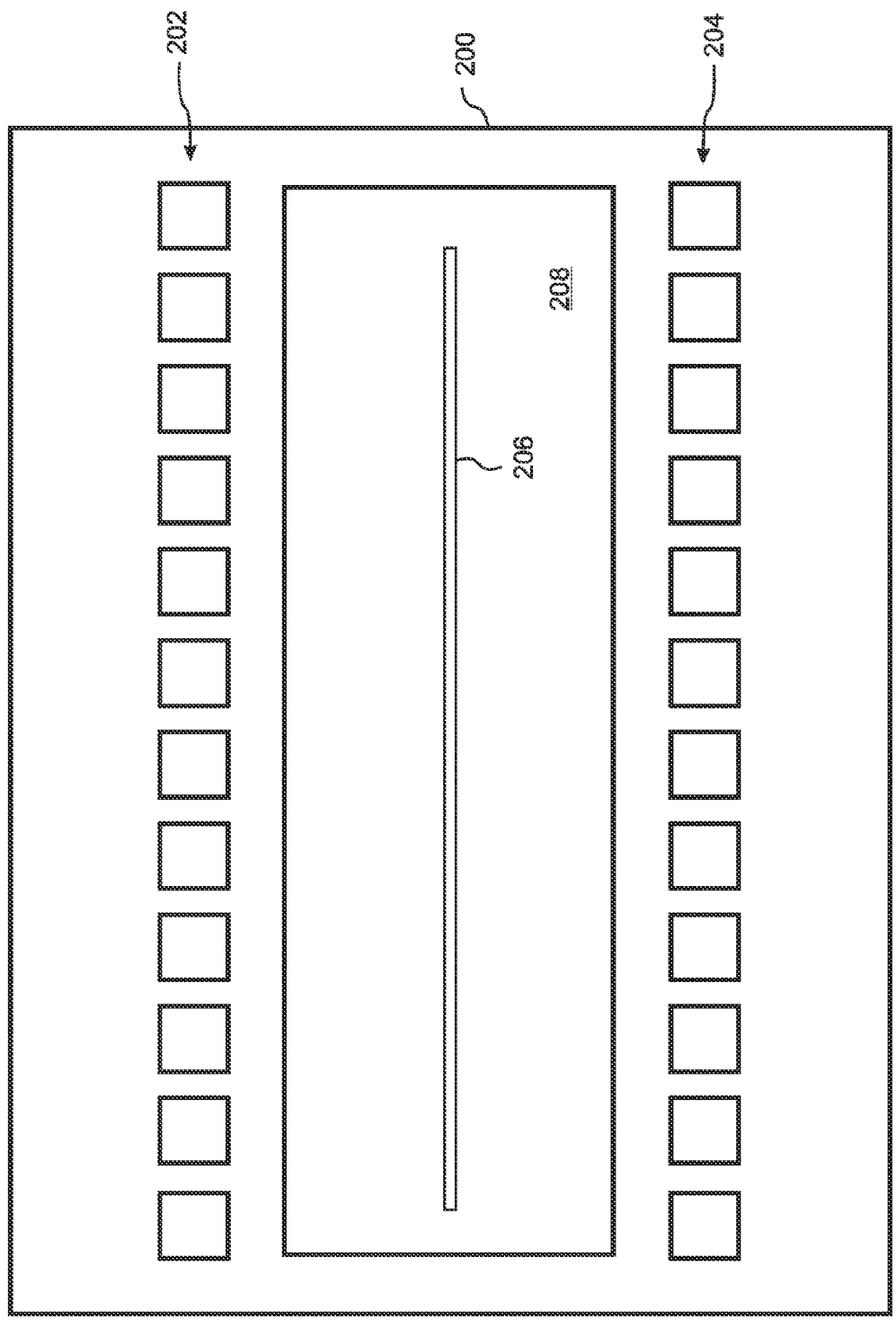
FIG. 2A is a front view of a diffraction slit surrounded by companion sensors in an embodiment of the present invention where the diffraction slit penetrates the silicon die.

With reference to FIG. 2A, the apparatus of the present invention overcomes these problems by using the silicon die 200 on which the companion sensors 202, 204 are fabricated as an integral part of the diffraction slit assembly, either by fabricating the diffraction slit with one or both blades made of a companion sensor die or wafer, or, as illustrated in FIG. 2, by etching or laser cutting the diffraction slit 206 directly into the silicon die 200. In embodiments, one of the techniques known in the art for etching or laser cutting in Micro Electro-Mechanical System (MEMS) applications is used to produce a slit of a desired width.

Although typical silicon dies are too thick (300-700 μm) to serve as diffraction slit blades, the thickness of the silicon die 200 in the present invention is reduced at least in a region 208 surrounding the slit 206 to a width that is suitable for the diffraction slit 206. This back-thinning of the silicon die is effected by any of several techniques known in the art, for example any of the techniques that are routinely used to produce back-illuminated Charge Coupled Device (CCD) sensors. In embodiments, the die is thinned to a thickness of between 25 μm and 100 μm, which is similar to the thickness of blades that are used in prior art spectrometer slits. In some embodiments, the back surface of the die 200 is coated or aluminized to ensure that the thinned silicone region 208 is opaque over the full range of wavelengths to be detected by the hyperspectral sensor array.

In embodiments, companion sensors occupy locations 202 where they will obtain data immediately after the hyperspatial sensor 110. In some of these embodiments, data obtained by the hyperspectral sensor 110 is used to identify regions of interest in the scene, and to cue acquisition or special processing of data by the companion sensors 202. In other embodiments, companion sensors occupy locations 204 where they will obtain data immediately before the hyperspatial sensor 110. In some of these embodiments, data obtained from a companion sensor 204 is used to cue actions by the hyperspatial sensor 110. For example, data storage capacity can be conserved by using the companion sensors 204 to cue the activation of the hyperspatial sensor 110, so that hyperspatial data is obtained only for scenes of interest.

The embodiment illustrated in FIG. 2A includes a 4096 pixel linear panchromatic sensor array 202, 204 with 5 micron pixel pitch located on either side of a 20 micron high diffraction slit 206 just beyond the back-thinned region 208 of the silicon wafer. The diffraction slit 206 is etched or laser cut through the thinned region 208. The resolution of the panchromatic images will be approximately five times greater than the resolution of the hyperspectral data, and locating arrays 202, 204 on either side of the slit 206 provides "before" 202 and "after" 204 panchromatic images, which simplifies automatic alignment of the panchromatic data with the hyperspectral data.

Figure 2B:
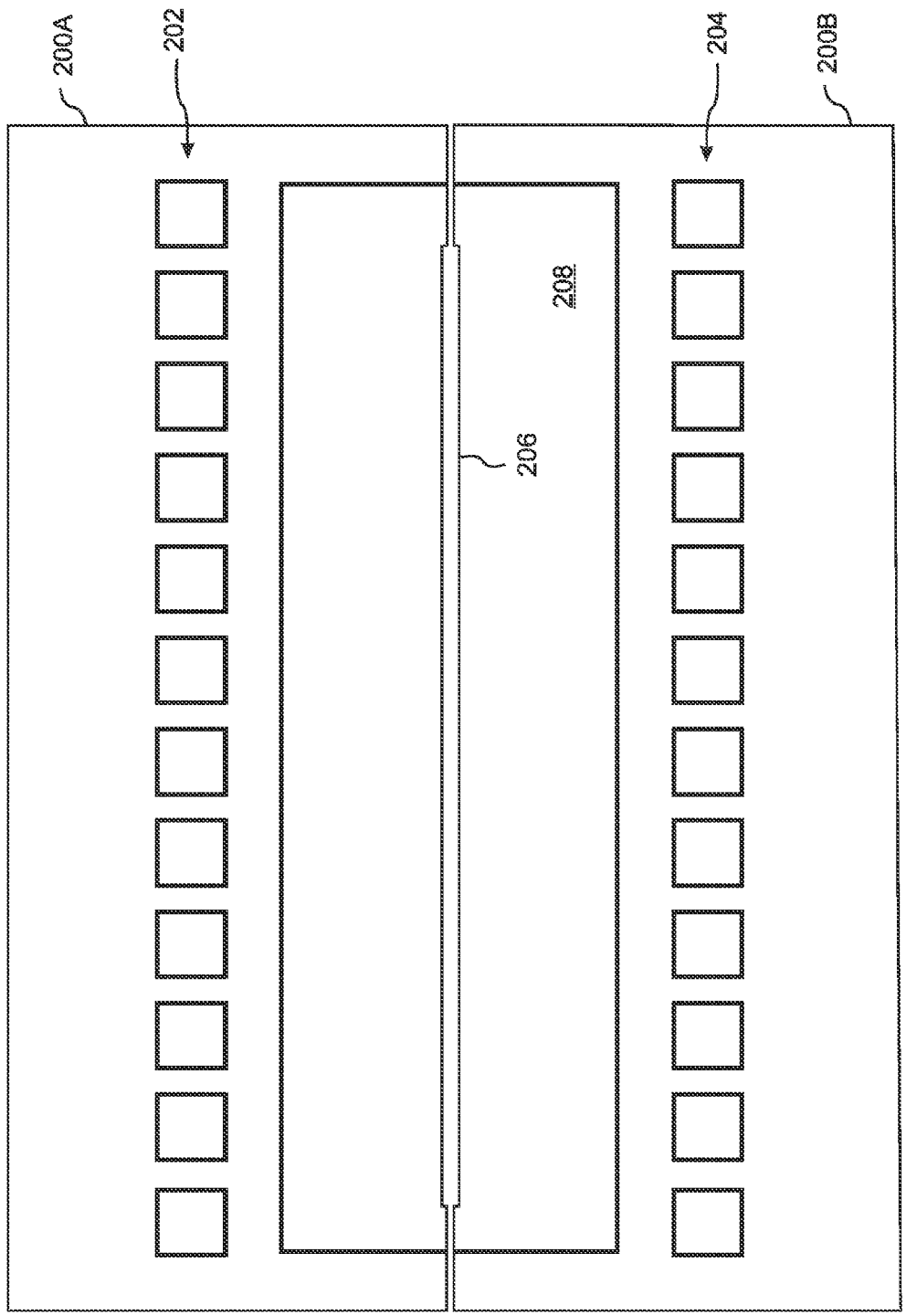
FIG. 2B is a front view of a diffraction slit formed between two blades, each of which is a silicon die that includes companion sensors.
Figure 2C:
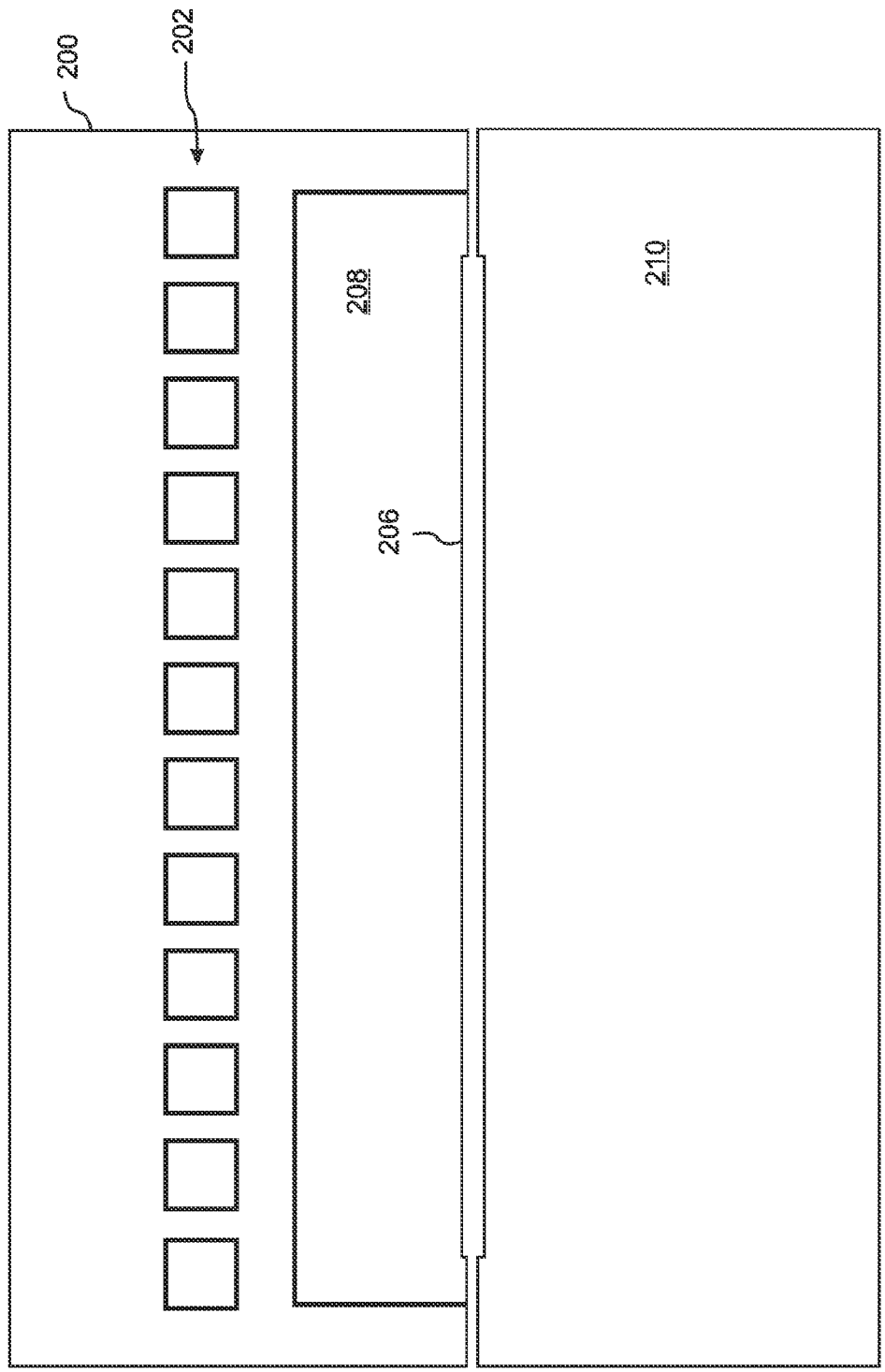
FIG. 2C is a front view of a diffraction slit formed between a silicon die blade that includes a companion sensor and a conventional blade.

FIG. 2B is a top view of an image panel similar to FIG. 2A, but formed by two silicon die blades 200A and 200B, where the two blades are shown as slightly separated for clarity of illustration. Companion sensors 202, 204 are fabricated into each of the die blades 200A, 200B. FIG. 2C is a top view of an image panel similar to FIG. 2B, but formed by one silicon die blade 200 and one conventional blade 210, where the two blades are shown as slightly separated for clarity of illustration. Companion sensors 202 are fabricated into the die blade.

Figure 3A:
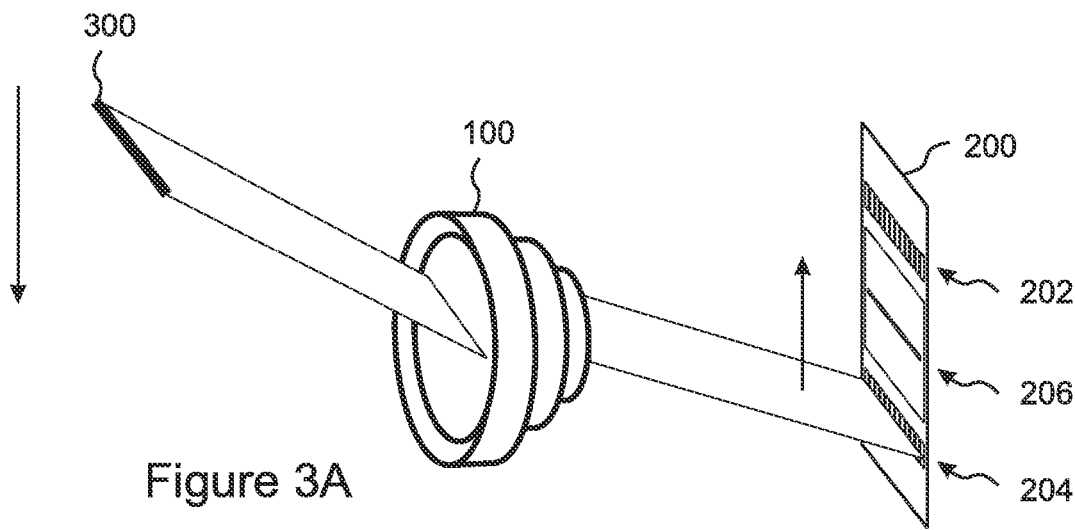
FIG. 3A is a perspective functional diagram showing a line from a scene being focused on a first row of companion sensors adjacent to a diffraction slit in an embodiment of the invention.
Figure 3B:
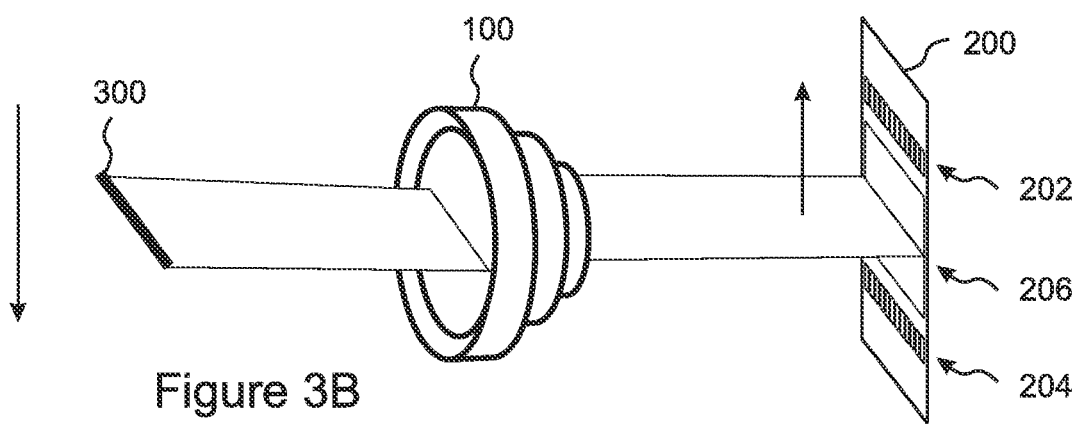
FIG. 3B is a perspective functional diagram showing the line from the scene being focused on the diffraction slit in the embodiment of FIG. 3A.
Figure 3C:
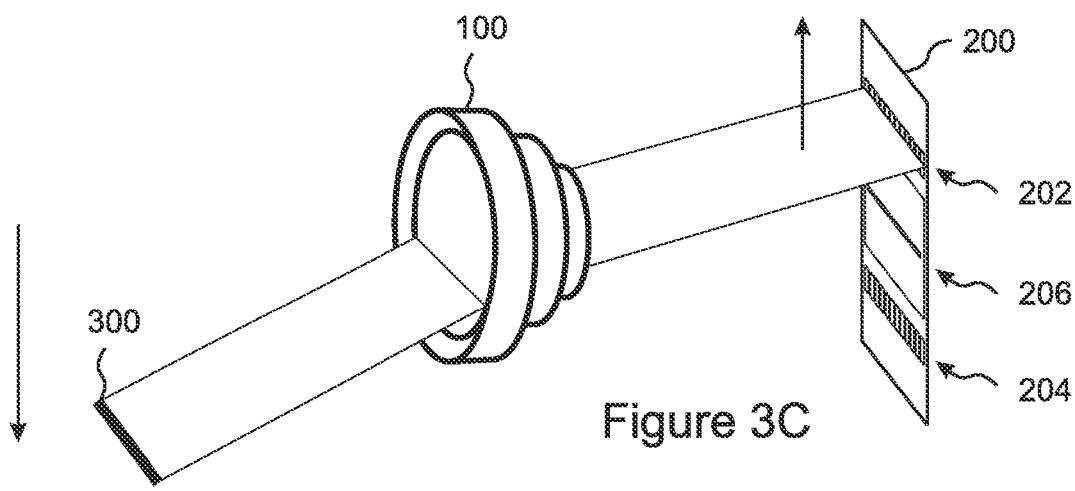
FIG. 3C is a perspective functional diagram showing the line from the scene being focused on a second row of companion sensors adjacent to the diffraction slit in the embodiment of FIG. 3A.

FIGS. 3A through 3C illustrate the focusing of a hypothetical "line" 300 included in a scene onto the silicon die 200 of FIG. 2 as the scene moves past the lens 100 of the hyperspectral camera (or the camera moves past the scene). In FIG. 3A, the line 300 of the scene is approaching the center of the field of view of the lens 100, and is focused onto the companion sensor array 204 that is below the diffraction slit 206. In FIG. 3B, the line 300 has reached the center of the field of view of the lens 100, and is focused onto the diffraction slit 206. In FIG. 3C, the line 300 has moved past the center of the field of view of the lens 100, and is focused on the companion sensor array 202 that is above the diffraction slit 206.

Those skilled in the art will also appreciate that embodiments of the present invention enable calibration of the hyperspectral data to be accomplished with reduced time and cost, improved repeatability, and with the ability for periodic updates.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An image panel for use in a hyperspectral camera that is configured to scan a scene and obtain spectral image data over a defined range of wavelengths, the image panel comprising:
   a silicon die having a planar image surface, a rear surface, and a die thickness;
   a thinned region of the silicon die having a diffraction thickness that is equal to or less than the die thickness;
   a diffraction slit formed at least in part by the thinned region of the silicon die, the diffraction slit having a width and a height; and
   at least one companion sensor fabricated in the silicon die and co-planar with the diffraction slit, the at least one companion sensor being located such that an image of a scene focused onto the diffraction slit will also be focused onto the at least one companion sensor.

2. The image panel of claim 1, wherein the thinned region of the silicon die extends to a side of the silicon die, and the diffraction slit is bounded in part by a segment of the thinned region at the side of the silicon die.

3. The image panel of claim 1, wherein the diffraction slit penetrates the thinned region of the silicon die.

4. The image panel of claim 1, wherein the at least one companion sensor is a panchromatic sensor.

5. The image panel of claim 1, wherein the at least one companion sensor is configured to detect light at a wavelength that is outside of the defined range of wavelengths.

6. The image panel of claim 1, wherein a coating is applied to at least a portion of the rear surface, the coating rendering the portion of the rear surface substantially opaque to light over the defined range of wavelengths.

7. The image panel of claim 1, wherein at least a portion of the rear surface is metalized, the metalized portion of the silicon die being substantially opaque to light over the defined range of wavelengths.

8. The image panel of claim 1, wherein the at least one companion sensor is located such that it will receive light from a portion of the scene immediately before light from the portion of the scene passes through the diffraction slit as the scene is scanned.

9. The image panel of claim 1, wherein the at least one companion sensor is located such that it will receive light from a portion of the scene immediately after light from the portion of the scene passes through the diffraction slit as the scene is scanned.

10. The image panel of claim 1, wherein the diffraction thickness is between 25 microns and 100 microns.

11. The image panel of claim 1, wherein the at least one companion sensor is a 4096 pixel linear panchromatic sensor array.

12. The image panel of claim 11, wherein the panchromatic sensor array has a five micron pixel pitch.

13. The image panel of claim 1, wherein the height of the diffraction slit is 20 microns.

* * * * *